(12) United States Patent
Kim

(10) Patent No.: US 9,466,754 B2
(45) Date of Patent: Oct. 11, 2016

(54) GRAIN GROWTH FOR SOLAR CELLS

(71) Applicant: Taeseok Kim, San Jose, CA (US)

(72) Inventor: Taeseok Kim, San Jose, CA (US)

(73) Assignee: SunPower Corporation, San Jose, CA (US)

( * ) Notice: Subject to any disclaimer, the term of this patent is extended or adjusted under 35 U.S.C. 154(b) by 168 days.

(21) Appl. No.: 14/447,526

(22) Filed: Jul. 30, 2014

(65) Prior Publication Data

US 2016/0035930 A1    Feb. 4, 2016

(51) Int. Cl.
| | |
|---|---|
| *H01L 21/00* | (2006.01) |
| *H01L 31/18* | (2006.01) |
| *B29D 11/00* | (2006.01) |
| *H01L 31/028* | (2006.01) |
| *H01L 31/0368* | (2006.01) |

(52) U.S. Cl.
CPC ......... *H01L 31/1864* (2013.01); *H01L 31/028* (2013.01); *H01L 31/03682* (2013.01); *H01L 31/1804* (2013.01); *H01L 31/1872* (2013.01); *Y02E 10/50* (2013.01); *Y02P 70/521* (2015.11)

(58) Field of Classification Search
None
See application file for complete search history.

(56) References Cited

U.S. PATENT DOCUMENTS

| | | | | |
|---|---|---|---|---|
| 5,714,404 A | * | 2/1998 | Mitlitsky | H01L 31/182 438/487 |
| 2009/0191670 A1 | * | 7/2009 | Heitzinger | H01L 29/66757 438/151 |
| 2010/0304522 A1 | * | 12/2010 | Rana | H01L 21/26586 438/71 |
| 2013/0312827 A1 | * | 11/2013 | Adachi | H01L 31/022425 136/256 |
| 2014/0017847 A1 | * | 1/2014 | Hyun | H01L 31/02363 438/71 |

* cited by examiner

*Primary Examiner* — Shamim Ahmed
(74) *Attorney, Agent, or Firm* — Blakely Sokoloff Taylor Zafman LLP

(57) ABSTRACT

A solar cell can include a silicon layer formed over a silicon substrate. The silicon layer can have a P-type doped region and an N-type doped region. Portions of the silicon layer can have a grain size larger than other portions of the silicon layer. For example, larger grains of the silicon layer formed within a depletion region between P-type and N-type doped regions can minimize recombination loss at the P-type and N-type doped region boundaries and improve solar cell efficiency.

16 Claims, 6 Drawing Sheets

GRAIN GROWTH FOR SOLAR CELLS

BACKGROUND

Photovoltaic (PV) cells, commonly known as solar cells, are well known devices for conversion of solar radiation into electrical energy. Generally, solar radiation impinging on the surface of, and entering into, the substrate of a solar cell creates electron and hole pairs in the bulk of the substrate. The electron and hole pairs migrate to P-type and N-type doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

Accordingly, techniques and structures for increasing the efficiency in the fabrication of solar cells are generally desirable.

DETAILED DESCRIPTION

Figure 1:
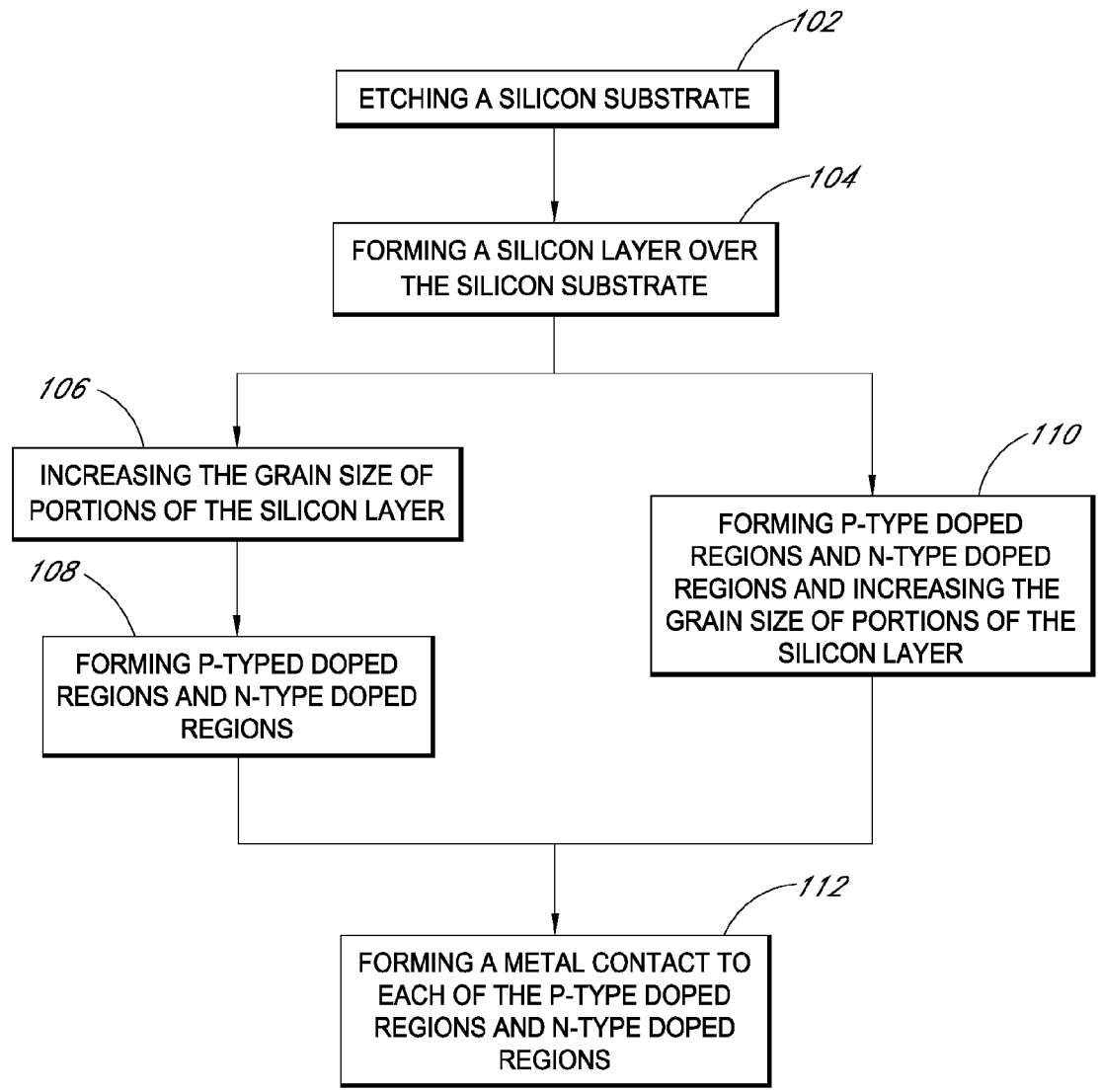
FIG. 1 illustrates a flow chart representation of a method of fabricating solar cell, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" silicon layer does not necessarily imply that this silicon layer is the first silicon layer in a sequence; instead the term "first" is used to differentiate this silicon layer from another silicon layer (e.g., a "second" silicon layer).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

Solar cells can be fabricated with P-type and N-type doped regions formed in a silicon substrate. Another way solar cells can be fabricated is with P-type and N-type doped regions formed in a silicon layer (e.g. a polysilicon layer) formed over a silicon substrate. For solar cells with doped regions formed in a silicon layer, recombination loss at regions where doped regions of opposite polarity touch can reduce and/or adversely affect solar cell efficiency. One way to eliminate or reduce this loss can be to physically separate P-type and N-type doped regions (e.g. through a trench structure). Another way can be to increase the grain size of the silicon layer to minimize the recombination loss at the boundaries of P-type and N-type doped regions of the silicon layer. The larger grain size at the boundaries of the P-type and N-type doped regions can increase the minority carrier lifetime in the silicon layer, decreasing recombination at the P-type and N-type doped region boundaries and improve solar cell efficiency. One technique to increase the grain size can be through a thermal drive-in process. Still another way to increase the grain size is disclosed herein.

This specification first describes an example method for fabricating a solar cell that can include increasing the grain size in portions of a silicon layer, followed by an embodiment of a solar cell structure. Various examples are provided throughout.

Turning now to FIG. 1, a flow chart illustrating a method for fabricating a solar cell is shown, according to some embodiments. In various embodiments, the method of FIG. 1 can include additional (or fewer) blocks than illustrated. For example, in some embodiments, a dielectric region may be formed on a silicon substrate prior to the formation of a silicon layer.

A silicon substrate can be provided. The silicon substrate can have crystalline structure (e.g. can be a single crystalline silicon substrate), where silicon atoms of the silicon substrate can be arranged in a periodic array. The crystalline structure of the silicon substrate can also be described in lattice planes and further specified by its Miller index (h, k, l), where h, k and l are integers. Also lattice planes that are symmetrically equivalent can be described collectively as a plane family. For example, the faces of a cubic cell, such as (100) plane, (010) plane, (001) plane, etc., can be described collectively as the {100} plane family. In another example, planes that intercept three orthogonal axes such as (111) plane, (-111) plane, (1-11) plane, etc. can be described collectively as the {111} plane family.

Figure 2:
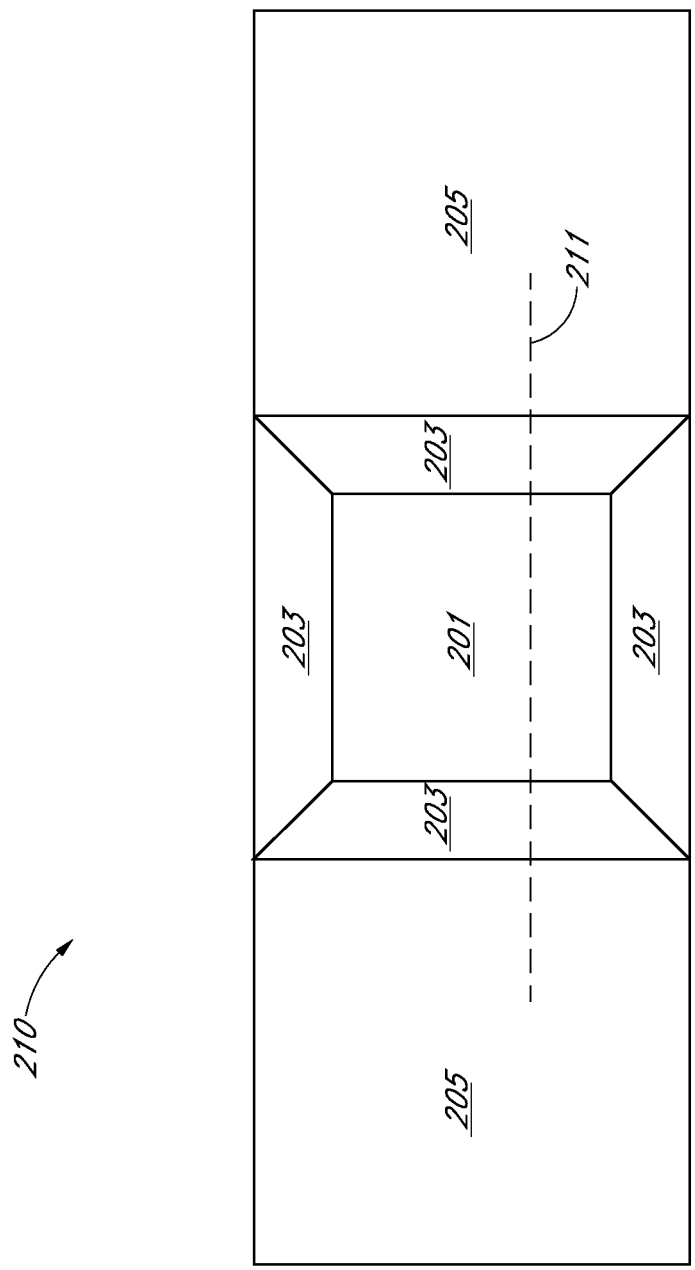
FIG. 2 illustrates a schematic plan view of a silicon substrate, according to some embodiments.
Figure 3:
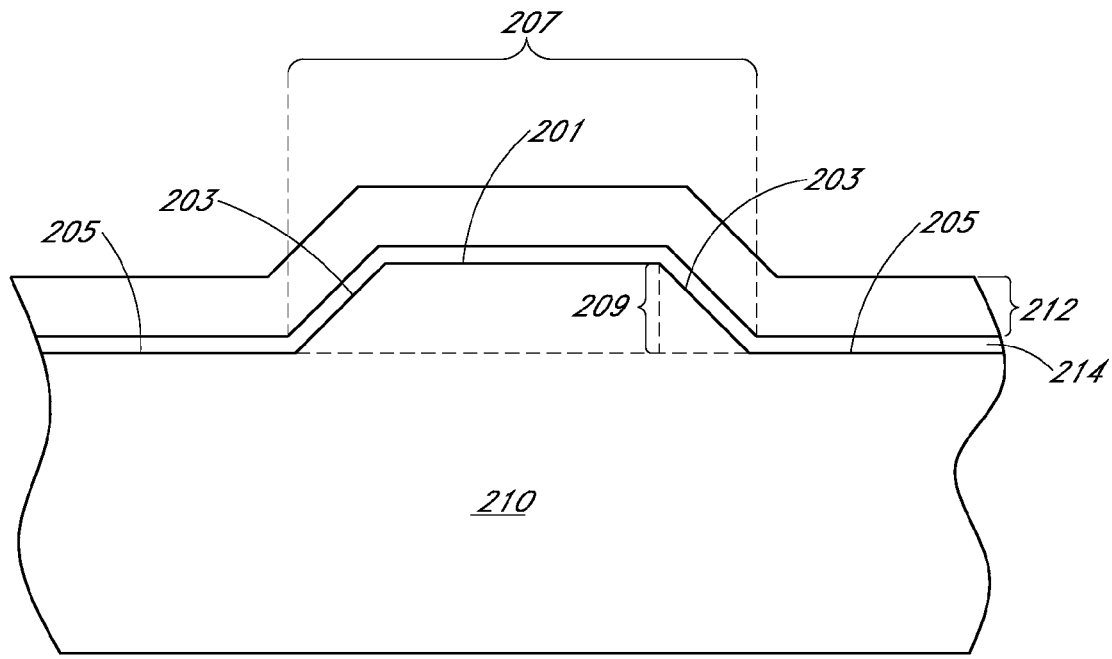
FIG. 3 illustrates a cross-sectional view of the silicon substrate of FIG. 2, according to some embodiments.

As shown in 102, a silicon substrate can be etched, cleaned, polished, planarized, thinned and/or otherwise processed. In an embodiment, the silicon substrate can have a surface approximately of the {100} plane family before an etching and/or cleaning process. In an embodiment, an etching, cleaning, polishing and/or planarization process can be used to form upper regions, angled regions and lower regions on the silicon substrate (e.g. as shown in FIG. 2 and FIG. 3). In an embodiment, the upper regions and lower regions can have a surface structure of the {100} plane family and the angled regions can have a surface structure of the {111} plane family. In some embodiments, potassium hydroxide (KOH) or any other anisotropic etching solution can be used in the etching process.

At 104, a silicon layer can be formed over the silicon substrate. In some embodiments, the silicon layer can be an amorphous silicon layer or a polysilicon layer. In an embodiment, a dielectric region can be formed on the silicon substrate prior to the formation of the silicon layer. In one embodiment, the dielectric region can be a tunnel oxide region formed between the silicon layer and the silicon substrate. In some embodiments, the tunnel oxide region can be silicon dioxide.

Figure 4:
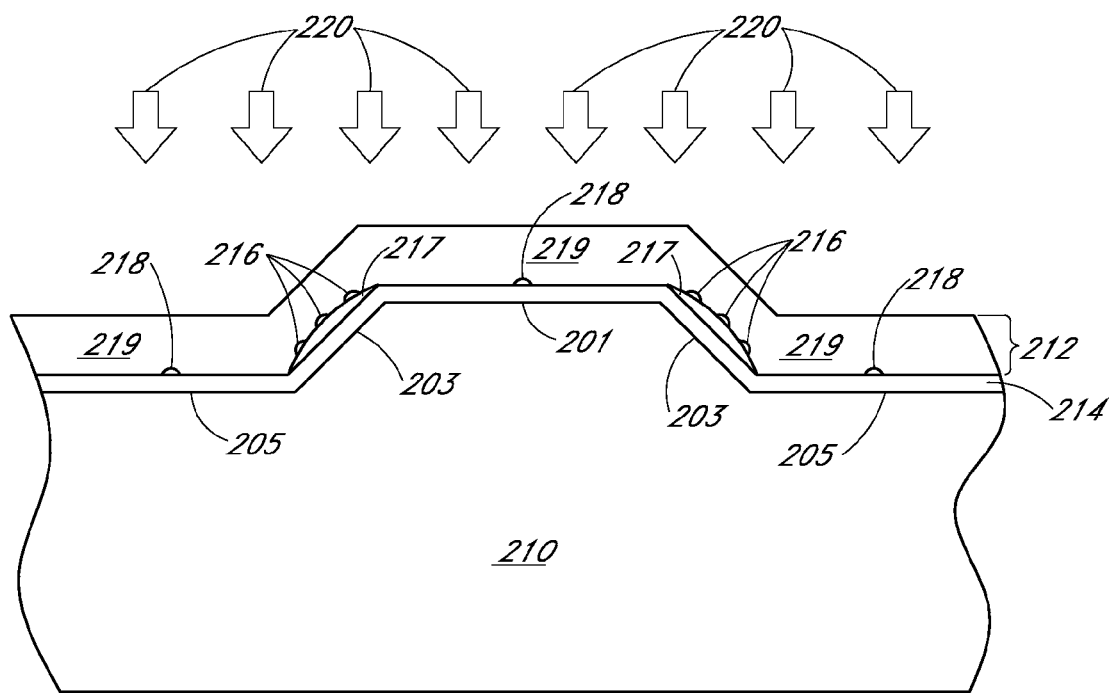
FIG. 4 illustrates a cross-sectional view of applying a laser to the silicon substrate of FIG. 3, according to some embodiments.

At 106, the grain sizes of portions of the silicon layer can be increased relative to other portions of the silicon layer. To increase the grain sizes, a laser can be applied to the silicon layer (e.g. as shown in FIG. 4) to melt the surface of the silicon layer. In an embodiment, applying the laser can melt portions of a surface of the silicon layer, leaving other portions of the silicon layer unmelted. For example, the portions of the silicon layer over the upper and lower regions of the silicon substrate can be melted and other portions of the silicon layer over the angled regions can be unmelted. In an embodiment, unmelted portions of the silicon layer can form nucleation sites over the upper, lower and angled regions. In an embodiment, cooling the silicon substrate can allow for grains in the silicon layer to begin growth from nucleation sites.

In one embodiment, the number of nucleation sites over the angled regions can be more abundant than over the upper and lower regions, where most of silicon layer can be melted over the upper and lower regions and portions of the silicon layer over angled regions can remain unmelted or solid.

The nucleation sites can act as seed regions for grain formation of the silicon layer. In an embodiment, the formation of large grain sizes can be guided by the angled regions (e.g., can be non-random), where larger grain sizes can be formed on the upper regions and the lower regions relative to the grain sizes formed over the angled regions. In one embodiment, larger grain sizes can grow adjacent to portions of the silicon layer over the angled regions of the silicon substrate.

In some embodiments different laser applications can be used to melt the surface of the silicon layer. In one embodiment, a pulsed laser, such as an excimer laser, diode pumped solid-state (DPSS) laser and/or a diode laser can be applied to the silicon layer. In some embodiments, a continuous wave laser can be applied to the silicon layer. In an embodiment, the laser can be applied from a transverse direction with respect to the silicon substrate (e.g., perpendicular to). In an embodiment, to maximize the laser fluence on the silicon layer, a laser having a top-hat profile can be used to melt the silicon layer. For example, the top-hat profile can allow for the application of an approximately uniform laser fluence to the silicon layer, where another beam profile, such as in a Gaussian profile, can have uneven intensity at the beam focus. In one embodiment, the laser can be applied in a pattern over where the depletion regions will eventually be formed or over the entire silicon substrate. In an embodiment, the laser can be applied to follow (e.g. along the boundaries of) an interdigitated pattern or a dotted pattern. In some embodiments, the laser can be scanned, for example directed from one location to another location of the silicon layer.

At 108 a first and second doped regions can be formed. In an embodiment, a first and second dopant source can be formed over the silicon layer. In one embodiment, the first dopant source can be a P-type dopant source and the second dopant source can be an N-type dopant source. In some embodiments, the P-type dopant source can be boron and the N-type dopant source can be phosphorous. In an embodiment, the first and second dopant sources and the silicon layer can be heated to drive dopants from the first and second dopant sources into the silicon layer. The heating can form a first doped region and a second doped region. In one embodiment, the first doped region can be a P-type doped region and the second doped region can be an N-type doped region. A depletion region, e.g. boundary between P-type and N-type doped regions, can be formed. In an embodiment, the larger grains mentioned at 106 can be located within the depletion region. In an embodiment, the larger grain sizes can increase minority carrier lifetime in the silicon layer, minimize recombination loss at the at the depletion region and improve solar cell efficiency.

In another embodiment, instead of performing blocks 106 and 108, a first and second doped region can be formed and the grain size of portions of the silicon layer can be increased in a single step at 110, after forming the silicon layer over the silicon substrate at 104.

In an embodiment, a first and second dopant source can be formed over the silicon layer. The first dopant source can be a P-type dopant source and the second dopant can be an N-type dopant source. In some embodiments, the P-type dopant source can be boron and the N-type dopant source can be phosphorous. In an embodiment, a laser can be applied to the silicon layer and the first and second dopant sources to drive dopants from the first and second dopant sources into the silicon layer. In an embodiment, driving dopants from the first and second dopant sources into the silicon layer results in a P-type doped region and an N-type doped region.

In an embodiment, applying the laser can also melt portions of a surface of the silicon layer, leaving other portions of the silicon layer unmelted. In an embodiment, unmelted portions of the silicon layer can form nucleation sites over the upper, lower and angled regions. In an embodiment, silicon substrate can be cooled to allow for grains in the silicon layer to begin growth from the nucleation sites.

In one embodiment, the number of nucleation sites over the angled regions can be more abundant than over the upper and lower regions, where most of silicon layer can be melted over the upper and lower regions and portions of the silicon layer over angled regions can remain unmelted or solid.

The nucleation sites can act as seed regions for grain formation of the silicon layer. In an embodiment, the formation of large grain sizes can be guided by the angled regions (e.g., can be non-random), where larger grain sizes can be formed on the upper regions and the lower regions relative to the grain sizes formed over the angled regions. In one embodiment, larger grain sizes can grow adjacent to portions of the silicon layer over the angled regions of the silicon substrate.

In one embodiment, the laser can be applied from a transverse direction with respect to the silicon substrate. In an embodiment, the laser can be applied over where the depletion regions will be formed or over the entire silicon substrate. In some embodiments, the laser can be scanned, for example directed from one location to another location of the silicon layer.

In an embodiment, larger grains can be formed within depletion regions between P-type and N-type doped regions. A depletion region, e.g. boundary between P-type and N-type doped regions, can be formed where the larger grains mentioned are located within the depletion region. In an embodiment, the larger grain sizes can increase minority carrier lifetime in the silicon layer, minimize recombination loss at the depletion region and improve solar cell efficiency.

Figure 7:
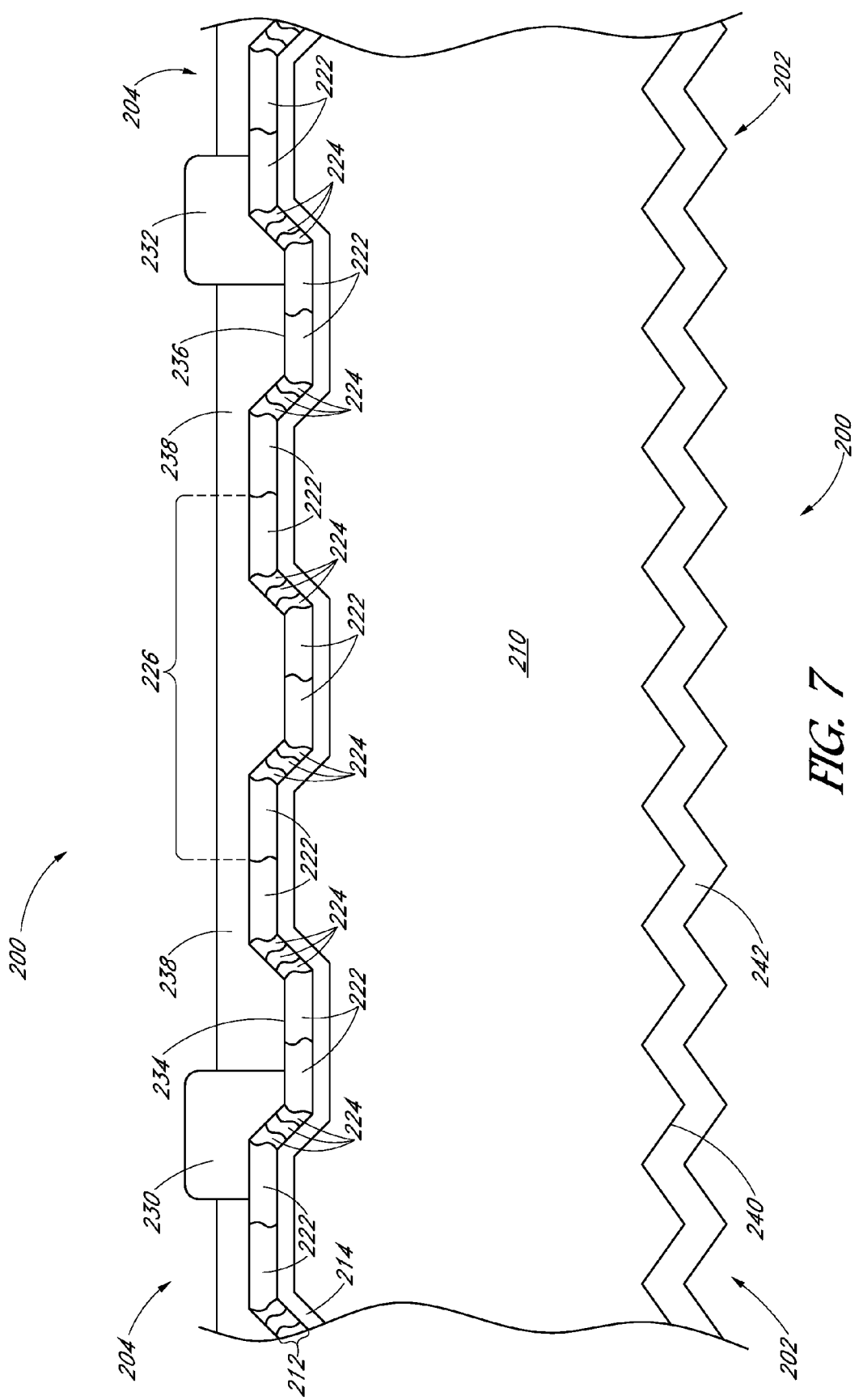
FIG. 7 illustrates an example solar cell, according to some embodiments.

As shown in 112, metal contacts can be formed to couple to the P-type and N-type doped regions. In an embodiment, prior to forming the metal contacts, a dielectric region can be formed over the P-type and N-type doped regions. In some embodiments, contact openings can be formed in the dielectric region to allow the metal contacts to be in direct contact with the P-type and N-type doped regions. An example solar cell having the structures described at FIG. 1 is shown in FIG. 7.

FIG. 2 illustrates a plan view of the surface of a portion of a silicon substrate subsequent to an etching process, according to some embodiments. The silicon substrate 210 can have upper regions 201, angled regions 203 and/or lower regions 205. As described in 102 of FIG. 1, the upper regions 201, angled regions 203 and/or lower regions 205 can be formed by an etching, cleaning, polishing and/or planarization process. In an embodiment, the silicon substrate 210 can have a surface of {100} plane family before the etching and/or cleaning process. In an embodiment, after etching, the upper regions 201 and lower regions 205 can have a surface structure of {100} plane family and the angled regions 203 can have a surface structure of the {111} plane family. A line 211 is shown for reference to the cross-sectional view of FIG. 3.

With reference to FIG. 3 a cross-sectional view of the silicon substrate of FIG. 2 after forming a silicon layer is shown. The silicon substrate 210 can include an upper region 201, angled region 203, and lower region 205. In an embodiment, a distance 209 of the upper region 201 from the lower region 205 can be in the range of 1-5 µm. In some embodiments, the width 207 of the upper region 201 (from end to end) can be in the range of 10-50 µm. In an embodiment, a silicon layer 212 can be formed over the silicon substrate 210. In some embodiments, the silicon layer 212 can be an amorphous silicon layer or a polysilicon layer. In one embodiment, a dielectric 214 can be formed over the silicon substrate 210 before forming the silicon layer 212. In some embodiments, the dielectric 214 can be a tunnel oxide, such as silicon dioxide, or some other dielectric.

FIG. 4 illustrates applying a laser to the silicon layer of FIG. 3. In an embodiment, applying the laser 220 can melt portions 219 of a surface of the silicon layer 212, leaving other portions 217 of the silicon layer 212 unmelted. In an embodiment, unmelted portions of the silicon layer 212 can form nucleation sites 216, 218 over the upper, lower and angled regions. In an embodiment, cooling the silicon substrate can allow for grains in the silicon layer 212 to begin growth from nucleation sites 216, 218 (e.g. superlateral growth).

In some embodiments, the laser melting process can be performed at temperatures that do not damage a dielectric layer (e.g., without dissolving a tunnel oxide) below the silicon layer. In various embodiments, the laser can be pulsed or applied or continuous or a combination thereof. In some embodiments, a pulsed laser or a continuous wave laser can be used. In an embodiment, a pulsed laser such as an excimer laser, diode pumped solid-state (DPSS) laser or a diode laser can be applied to the silicon layer 212. In one embodiment, a laser 220 having a top-hat profile can be used. The top-hat profile can allow for the application of an approximately uniform laser fluence to the silicon layer, where another beam profile can have uneven intensity at the beam focus (e.g. as in a Gaussian profile).

In an embodiment, the laser fluence received at portions of the silicon layer 212 over upper regions 201 and lower regions 205 can be higher than the laser fluence received by areas of the silicon layer 212 over the angled regions 203. Thus, some portions 219 of the silicon layer can be melted 219 and other portions 217 can remain unmelted (e.g. solid). In an embodiment, the unmelted regions 217 over the angled regions 203 can have a higher number of nucleation sites 216 than other nucleation sites 218 formed over the upper and lower regions 201, 205.

Figure 5:
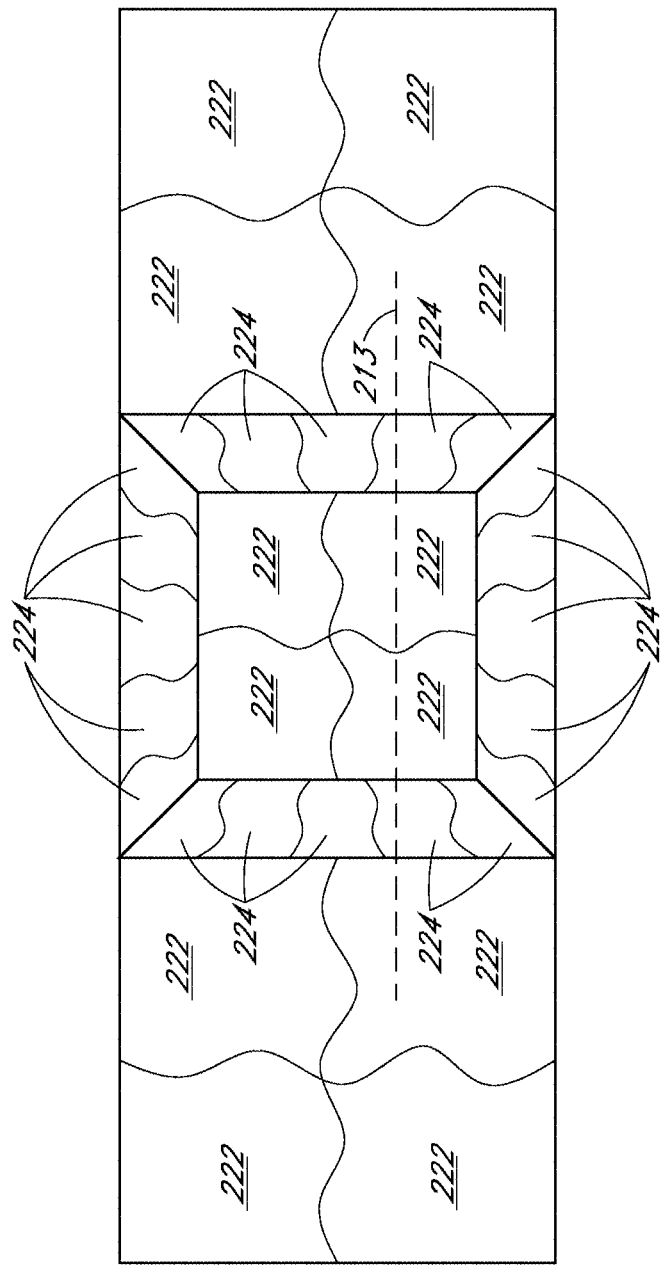
FIG. 5 illustrates a schematic plan view of a silicon substrate of FIG. 4 after applying a laser, according to some embodiments.

With reference to FIG. 5, a plan view of the silicon substrate of FIG. 4 after applying a laser is shown, according to some embodiments. In an embodiment, grains 222, 224 are formed after applying the laser to the silicon layer. In an embodiment, larger grains 222 can be formed over upper regions and lower regions of the silicon substrate. In an embodiment, smaller grains 224 can be formed over the angled regions of the silicon substrate. In one embodiment, the formation of larger grains 222 over the upper and lower regions can be guided by the nucleation sites formed over the angled regions of the silicon substrate (e.g. non-random), where the larger grain sizes 222 can grow adjacent to portions of the silicon layer over to the angled regions of the silicon substrate. A line 213 is shown for reference to the cross-sectional view of FIG. 6.

Figure 6:
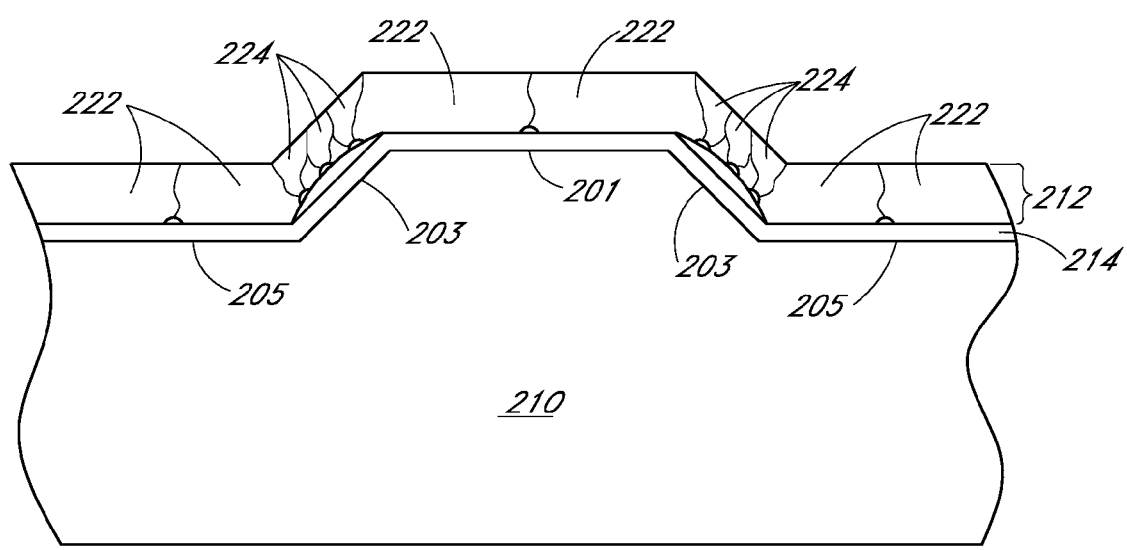
FIG. 6 illustrates a cross-sectional view of the silicon substrate of FIG. 5, according to some embodiments.

FIG. 6 illustrates a cross-sectional view of the silicon substrate of FIG. 5, according to some embodiments. In an embodiment, the grain sizes 222 over the upper regions 201 and lower regions 205 can be larger than the grain sizes 224 formed over the angled regions 203. In an embodiment, the formation of large grain sizes 222 can be guided by the angled regions 203 (e.g., can be non-random), where larger grain sizes 222 can be formed on the upper regions 201 and the lower regions 205 relative to the grain sizes 224 formed over the angled regions 203. In one embodiment, larger grain sizes 222 can grow adjacent to portions 224 of the silicon layer 212 over the angled regions 203 of the silicon substrate 210. In an embodiment, the grain growth sizes 222 of the silicon layer 212 over the upper regions 201 and lower regions 205 can be in the same range as the size of the upper regions 201 and lower regions 205 of the silicon substrate 210. In an embodiment, grains can grow laterally from nucleation sites (e.g. 216 of FIG. 4) over either the upper or lower regions 201, 205 forming larger grains 222. In an embodiment, grains can grow vertically from nucleation sites (e.g. 216 of FIG. 4) over the angled regions 203 forming smaller grains 224.

In an embodiment, the smaller grain sizes 224 can be less than 1 µm. In an embodiment, the larger grain sizes 222 can be greater than or equal to 1 µm.

FIG. 7 illustrates an example solar cell, according to some embodiments. In an embodiment, a solar cell 200 can be fabricated using the methods described herein. In an embodiment, the solar cell 200 can have a front side 202 configured to face the sun during normal operation and a back side 204 opposite the front side 202. The solar cell 200 can also include a silicon substrate 210. The silicon substrate 210 can include upper regions, angled regions, and lower regions (e.g. as shown in FIGS. 2-6).

In an embodiment, the solar cell 200 can also include a textured region 240 and front dielectric region 242. In one embodiment, the textured region 240 can allow for increased light absorption. In some embodiments, the textured region 240 can be formed by an etching, cleaning, polishing and/or planarization process. In an embodiment, the front dielectric region 242 can be an anti-reflective region. In one embodiment, the front dielectric region 242 can be silicon nitride.

In an embodiment, the solar cell 200 can include a first back dielectric 214 formed between the silicon substrate 210 and a silicon layer 212. In one embodiment, the first back dielectric 214 can be a tunnel oxide. In an embodiment, the tunnel oxide can be silicon dioxide. In an embodiment, the silicon layer 212 can be polysilicon.

In an embodiment, portions of the silicon layer 222 can have larger grain sizes 222 than other portions 224 (e.g. as shown in FIGS. 5 and 6). In an embodiment, the size of the grains 222 can be in the same range as the size of upper regions and lower regions. In an embodiment, the solar cell 200 can also include a P-type doped region 234 and an N-type doped region 236 having a depletion region 226 abutting (e.g. contiguous) at the junction between P-type doped regions 234 and N-type doped regions 236. In an embodiment, the P-type doped regions 234 and N-type doped regions 236 can be doped polysilicon regions.

In an embodiment, the larger grains 222 can be formed in the depletion region 226 and/or contiguous portion between the P-type and N-type doped regions 234, 236 of the silicon layer 212. In an embodiment, the larger grains 222 formed within the depletion region 226 can minimize recombination loss at the P-type and N-type doped region boundaries and result in increased efficiency of the solar cell 200.

In one embodiment, the smaller grains 224 can be less than 1 µm. In an embodiment, the larger grains 222 can be greater than or equal to 1 µm. In an embodiment, the total average grain size (e.g. of both large and small grains) can be greater than or equal to 1 µm. In some embodiments, larger grain sizes 222 can be adjacent to portions of the silicon layer 212 over to the angled regions of the silicon substrate 210. In an embodiment, smaller grains 224 can be formed over the angled regions of the silicon substrate 210.

The solar cell 200 can have metal contacts 230, 232, where a metal contact 230 can be coupled to the P-type doped region 234 and another metal contact 232 can be coupled to a N-type doped regions 236. In an embodiment, there can be more than two metal contacts formed. The solar cell 200 can also include a second back dielectric 238. In an embodiment, the second back dielectric 238 can be a back anti-reflective region. In one embodiment, the second back dielectric 238 can be silicon nitride.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:
   forming upper regions, angled regions and lower regions of a silicon substrate, wherein the upper regions and the lower regions are substantially coplanar;
   forming a silicon layer over the silicon substrate;
   applying a laser to the silicon layer resulting in portions of the silicon layer over the upper regions and lower regions having a larger grain size than other portions of the silicon layer over angled regions of the silicon substrate; and
   driving dopants into the silicon layer resulting in P-type doped regions and N-type doped regions, the P-type doped regions and N-type doped regions abutting in a contiguous portion of the silicon layer.

2. The method of claim 1, wherein forming upper regions, angled regions and lower regions comprises performing an etching process on the silicon substrate.

3. The method of claim 2, wherein performing the etching process comprises etching with potassium hydroxide (KOH).

4. The method of claim 1, further comprising forming a dielectric region between the silicon layer and the silicon substrate.

5. The method of claim 1, wherein applying a laser comprises applying a pulsed laser or a continuous wave laser.

6. The method of claim 1, wherein applying a laser comprises melting portions of the silicon layer.

7. The method of claim 1, wherein applying a laser comprises applying a laser with a top-hat profile on the on the silicon layer.

8. The method of claim 1, wherein forming a silicon layer comprises forming an amorphous silicon layer or a polysilicon layer.

9. A method of fabricating a solar cell, the method comprising:
   forming upper regions, angled regions and lower regions of a silicon substrate, wherein the upper regions and the lower regions are substantially coplanar;
   forming a silicon layer over the silicon substrate; and
   applying a laser to the silicon layer resulting in P-type doped regions and N-type doped regions and portions of the silicon layer over the upper regions and lower regions having a larger grain size than other portions of the silicon layer over angled regions of the silicon substrate, the larger grain size formed in a contiguous portion of the silicon layer where the P-type doped regions and N-type doped regions abut.

10. The method of claim 9, wherein forming upper regions, angled regions and lower regions comprises performing an etching process on the silicon substrate.

11. The method of claim 10, wherein performing the etching process comprises etching with potassium hydroxide (KOH).

12. The method of claim 9, further comprising forming a dielectric between the silicon layer and the silicon substrate.

13. The method of claim 9, wherein applying a laser comprises applying a pulsed laser or a continuous wave laser.

14. The method of claim 9, wherein applying a laser comprises:
   driving dopants into the silicon layer using a laser resulting in P-type doped regions and N-type doped regions; and
   melting the portions of the silicon layer using the laser in a single step as the driving, the melting resulting in portions of the silicon layer over the upper regions and lower regions having a larger grain size than other portions of the silicon layer and the larger grain size formed in a contiguous portion of the silicon layer where the P-type doped regions and N-type doped regions abut.

15. The method of claim 9, wherein applying a laser comprises applying a laser with a top-hat profile on the on the silicon layer.

16. The method of claim 9, wherein forming a silicon layer comprises forming an amorphous silicon layer or a polysilicon layer.

* * * * *